United States Patent
Murzeau et al.

(10) Patent No.: US 9,015,466 B2
(45) Date of Patent: Apr. 21, 2015

(54) DEVICE FOR CONFIGURING A PROGRAMMABLE COMPONENT, SYSTEM INCORPORATING SAID DEVICE, AND RELATED METHOD

(75) Inventors: Jean Murzeau, Cholet Cedex (FR); Jacques Galland, Cholet Cedex (FR); Sebastien Geairon, Cholet Cedex (FR)

(73) Assignee: Thales, Neuilly sur Seine (FR)

( * ) Notice: Subject to any disclaimer, the term of this patent is extended or adjusted under 35 U.S.C. 154(b) by 653 days.

(21) Appl. No.: 13/227,365

(22) Filed: Sep. 7, 2011

(65) Prior Publication Data

US 2012/0117371 A1    May 10, 2012

(30) Foreign Application Priority Data

Sep. 8, 2010   (FR) ...................................... 10 03578

(51) Int. Cl.
*G06F 1/24* (2006.01)
*G06F 9/00* (2006.01)
*H03K 19/177* (2006.01)
*G06F 15/78* (2006.01)

(52) U.S. Cl.
CPC .......... *H03K 19/177* (2013.01); *G06F 15/7871* (2013.01)

(58) Field of Classification Search
CPC ... G06F 9/44526; G06F 9/44508; G06F 8/65; G06F 9/44502; G06F 15/7867

USPC .................................................. 713/1, 2, 100
See application file for complete search history.

(56) References Cited

U.S. PATENT DOCUMENTS

| 7,397,274 B1* | 7/2008 | Tang et al. ...................... 326/40 |
| 7,495,970 B1* | 2/2009 | Tang et al. ............... 365/189.08 |
| 7,631,223 B1 | 12/2009 | Spinti et al. |
| 2009/0085603 A1 | 4/2009 | Paul et al. |

OTHER PUBLICATIONS

French Search Report and Written Opinion issued in French Application No. FR 10 03578, filed on Sep. 8, 2010.

* cited by examiner

*Primary Examiner* — Zahid Choudhury
(74) *Attorney, Agent, or Firm* — McDermott Will & Emery LLP

(57) ABSTRACT

This device includes a programmable component having an output able to send an inhibiting signal upon successful configuration of the programmable component and an input able to receive a reconfiguration signal; an automatic burn-in circuit for the configuration of the programmable component, having: selection means which, in a first state, connect the programmable component to a first configuration memory space and, in a second state, connect the programmable component to a second configuration memory space; and watchdog means having an input able to receive the inhibition signal and an output for sending, when no inhibition signal has been received for a predetermined period of time, a configuration signal intended for the programmable component to command the reconfiguration thereof and of the selection means to modify the state thereof.

15 Claims, 4 Drawing Sheets

DEVICE FOR CONFIGURING A PROGRAMMABLE COMPONENT, SYSTEM INCORPORATING SAID DEVICE, AND RELATED METHOD

CROSS REFERENCE TO RELATED APPLICATIONS

The present application claims priority under 35 U.S.C. §119 to French Patent Application No. 10 03578, filed Sep. 8, 2010, which is incorporated herein by reference.

FIELD OF TECHNOLOGY

The invention relates to the field of programmable components. More particularly, the invention relates to the field of programmable components capable of managing the update of their own configuration.

BACKGROUND

When a system comprising a programmable component needing to be configured is turned on, the programmable component initiates a configuration phase during which it reads a configuration file ("bitstream") contained in a read-only memory to which the programmable component is directly connected.

At the end of the configuration phase, if the configuration file does not contain any errors, the programmable component is configured according to the configuration file.

In certain configurations, a microprocessor is thus "embedded" in the programmable component. This microprocessor is then able to execute the instructions of an application code stored in another read-only memory, called application memory, which is also directly connected to the programmable component. The application code is dedicated to the microprocessor which has been configured and is therefore associated with a configuration file.

Advantageously, owing to the microprocessor, the application code makes it possible, to download from outside the system and write in the corresponding memories, a new configuration file and the related application code. For example, this new configuration file corresponds to a version of the microprocessor incorporating functional evolutions, fixes for "bugs," etc.

However, if the configuration file is corrupted, the configuration phase of the programmable component fails and the programmable component is in a state that does not make it possible to execute the application code.

In that situation, the system is not operational. In particular, it is incapable of downloading a new configuration file that would make it possible to correctly reconfigure the programmable component. It is thus necessary to bring the system back to its manufacturer so the latter can force the reconfiguration of the programmable component from a configuration file stored in an external memory relative to the system, the programmable component accessing this memory using a removable connector of the "JTAG" type.

SUMMARY

The invention therefore aims to resolve the aforementioned problems. In particular, the invention aims to burn in the start-up of a programmable component.

To that end, the invention relates to a device including:
a programmable component capable of managing its own configuration, from a configuration file, having an output able to send an inhibiting signal upon successful configuration of the programmable component and an input (CONFIG) able to receive a reconfiguration signal;
an circuit for the automatic burn-in of the configuration of the programmable component, having:
  means for selecting having at least two states, in a first state, the selection means can connect the programmable component to a first configuration memory space having a first configuration file, at least when the programmable component seeks to access a configuration file in read mode and, in a second state, the selection means can connect the programmable component to a second configuration memory space having a second configuration file, at least when the programmable component seeks to access a configuration file in read mode; and
  watchdog means having an input (WDI1) able to receive the inhibition signal sent by the programmable component and an output (WD0) able to send, when no inhibition signal has been received for a predetermined period of time, a configuration signal intended for the programmable component to command the reconfiguration thereof and for the selection means to modify the state thereof.

According to specific embodiments, the device includes one or more of the following features, considered alone or according to all technically possible combinations:
the programmable component, once configured as a microprocessor, can execute an application code associated with the configuration file used, and the selection means can:
  in said first state, connect the programmable component to a first application memory space (32) having a first application code (33), at least when the programmable component seeks to access an application in ready-only mode; and
  in said second state, connect the programmable component to a second application memory space (34) having a second application code (35), at least when the programmable component seeks to access an application in read-only mode.
the selection means comprise:
  a latch with at least two states including an input (CLK) for controlling a change in the state of the latch and an output (Q) indicating the current state of the latch, said input being connected to said output (WD0) of the watchdog means able to send a reconfiguration signal; and
  a plurality of logic components that can connect the programmable component to the first configuration memory space or to the second configuration memory space, depending on the current state of the latch.
the plurality of logic components can connect the programmable component to the first application memory space or the second application memory space, depending on the current state of the latch.
the programmable component has an output pin (CS0) on which it can send an access signal indicating that it is trying to access a configuration file, and the plurality of logic components can connect the programmable component to the first configuration memory space or the second configuration memory space, depending on the current state of said access signal.
the programmable component has an output pin (ADR0 [24]) on which it can send an access signal indicating that it is seeking to access an application code, and the plurality of logic components can connect the programmable component to the first application memory space or the second application memory space, depending on the current state of said access signal.

the first configuration memory space is a non-reconfigurable memory and has a factory configuration file, in that said second configuration memory space is a reconfigurable memory and has an update configuration file, and the programmable component being configured from the factory configuration file or the update configuration file, said selection means can connect the programmable component to the second configuration memory space, at least when the programmable component seeks to access a configuration memory in write mode to write a new update configuration file there.

the programmable component has an output (WR) on which it can send a write-mode selection signal for a configuration memory space in which to write a new configuration file, and the plurality of logic components can connect the programmable component to the first configuration memory space or the second configuration memory space, depending on the write-mode selection signal.

the programmable component includes the burn-in circuit for the configuration.

the programmable component is of the FPGA type.

The invention also relates to a programmable system, characterized in that it has a device according to the device presented above, as well as first and second configuration memory spaces respectively including first and second configuration files, and first and second application memory spaces respectively including first and second application codes, the first code being executable by the programmable component of said device configured from said first configuration file and the second code being executable by the programmable component of said device configured from said second configuration file, the burn-in circuit of the configuration of the programmable component serving as a connection interface between the programmable component and said memory spaces.

Preferably, the system is closed.

The invention also relates to a configuration method for a programmable component capable of managing its own configuration, from a configuration file, including the following steps:

connecting the programmable component to a first configuration memory space including a first configuration file, at least when the programmable component seeks to access a configuration file in read mode; and, in the event the configuration of the programmable component fails, from the first configuration file;

commanding a reconfiguration of the programmable component and connecting the programmable component to a second configuration memory space having a second configuration file at least when the programmable component seeks to access a configuration file in read mode.

According to particular embodiments, the method includes one or more of the following features, considered alone or according to all technically possible combinations:

the programmable component, once configured as a microprocessor, being able to execute an application code associated with the configuration file used, the method includes the following steps:

connecting the programmable component to a first application memory space including a first application code, at least when the programmable component is seeking to access an application code in read mode; and, in the event the configuration of the programmable component from the first configuration file fails, connecting the programmable component to a second application memory space having a second application code, at least when the programmable component is seeking to access an application code in read mode.

once the programmable component is configured using the configuration file contained in one of the first and second configuration memory spaces and executing the associated application code, the method includes the following steps:

downloading by the programmable component of a new configuration file;

connecting the programmable component to the other configuration memory space when the programmable component is seeking to access the configuration memory space in write mode.

BRIEF DESCRIPTION OF THE DRAWINGS

The invention and its advantages will be better understood upon reading the following description, provided solely as an example, and done in reference to the appended drawings, in which.

DETAILED DESCRIPTION

Figure 1:
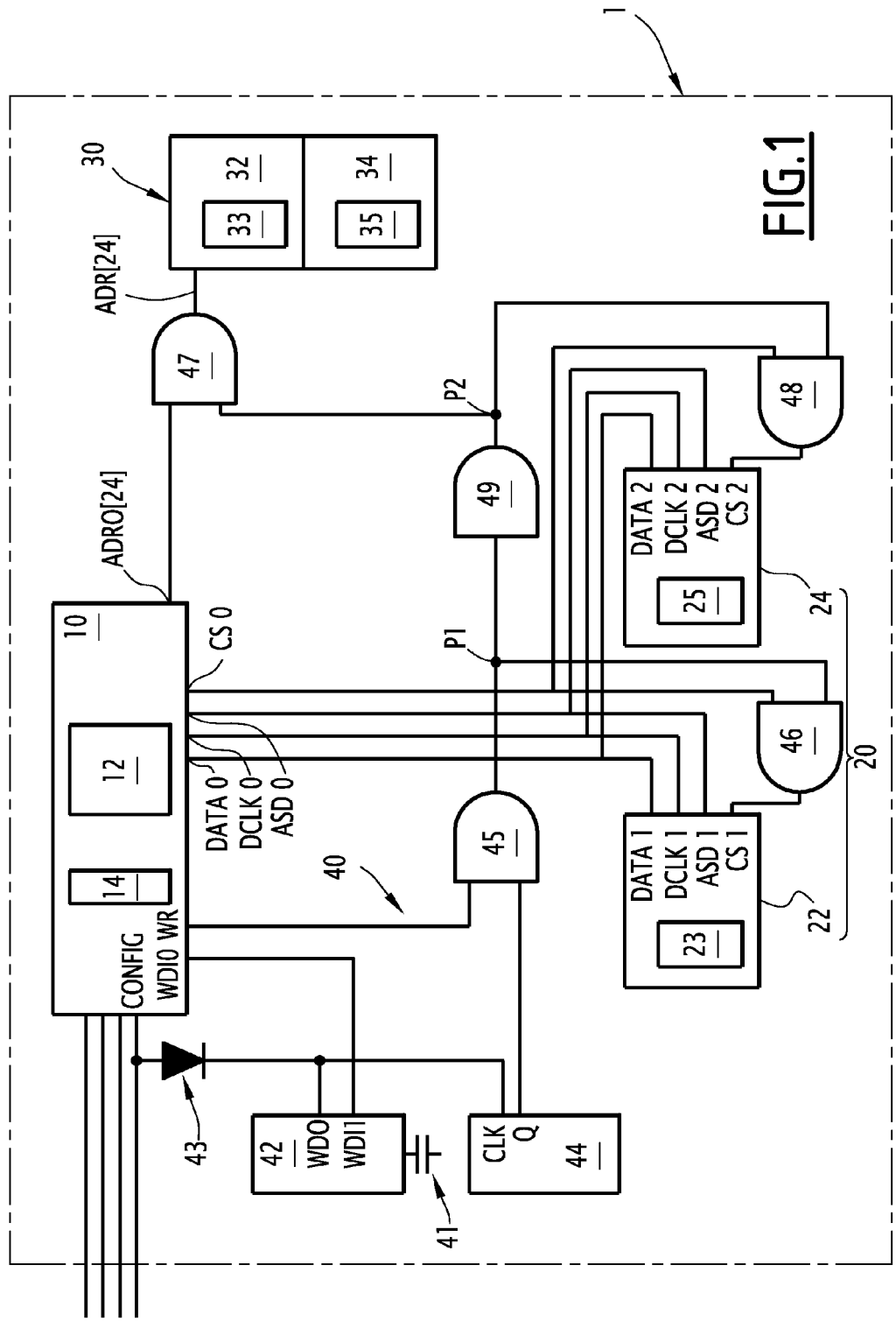
FIG. 1 is a diagrammatic illustration of an embodiment of the system having a programmable component and a burn-in circuit for its configuration.

The system 1 shown in FIG. 1 includes:
a programmable component 10;
a configuration memory 20;
an application memory 30; and
a burn-in circuit 40 for the configuration of the programmable component grouping together all of the other components shown in FIG. 1.

The programmable component 10 is of the FPGA (Field Programmable Gate Array) type. It includes a programmable core 12 comprising a plurality of input/output pins and logic elements. The core 12 also comprises a routing matrix that can be programmed to connect the logic elements to each other and/or with the input/output pins.

The programmable component 10 also has a configuration logic block 14 that can configure the core 12 from a configuration file that the logic block 14 reads in a read-only configuration memory connected to the programmable component.

Once the programmable component is correctly configured, the core 12 can read an application code to be executed, from a read-only application memory connected to the programmable component.

The configuration memory 20 has a first read-only memory 22 of the Flash memory type and a second read-only memory 24 of the Flash memory type. The first memory stores a first configuration file 23. The second memory stores a second configuration file 25.

The application memory 30 has a first read-only memory of the Flash memory type comprising a first memory zone 32 and a second memory zone 34. The first zone stores a first application code 33. The second zone stores a second application code 35.

The burn-in circuit 40 includes watchdog means and selection means with at least two states. The watchdog means are a watchdog circuit 42, while the selection means include the following elements:

A latch 44 with two states;

Four "OR" logic elements 45 to 48 that can generate as output a binary signal whose value corresponds to an "OR" between the values of two binary signals applied thereto as input; and A logic inverter element 49 that can generate as output a binary signal whose value is opposite to the value of the binary signal applied thereto as input.

The programmable component 10 includes the following connecting pins:

CONFIG: input pin on which a reconfiguration signal of the programmable component is received;

WDI0 (WatchDog Input): output pin on which an inhibition signal of the watchdog circuit is sent;

WR (WRite select): output pin on which a write-mode selection signal is sent making it possible to select the memory space in which to write a new configuration file: if the level of this signal is set low, the writing is done in the memory space whereof the configuration file was used to perform the current configuration of the programmable component; if the level of this signal is high, the writing is done in the memory space opposite that containing the configuration file that was used to perform the current configuration of the programmable component;

DATA0, DCLK0, ASD0: three read/write pins in the configuration memory connected to the programmable component;

CS0: output pin on which an access signal to the configuration memory connected to the programmable component is sent;

ADR0[24]: output pin on which a signal is sent indicating a write phase of a new application code in the application memory connected to the programmable component.

The first configuration memory 22 includes the following connecting pins:

DATA1, DCLK1, ASD1: three pins for read/write access to the memory;

CS1: input pin for receiving an access signal indicating the selection of the memory.

The second configuration memory 24 includes the following connecting pins:

DATA2, DCLK2, ASD2: three pins for read/write access to the memory;

CS2: input pin for receiving an access signal indicating the selection of the memory.

The application memory 30 includes an address pin corresponding to the bit with the highest weight (here bit 24). If the state of the signal applied on that pin is set low 0, the address of the memory 30 that will be accessed will belong to the first zone 32. If the state of the signal applied on the pin is high 1, the address of the memory 30 that will be accessed will belong to the second zone 34. The application memory includes a plurality of other pins connected to the same number of pins of the programmable component 10 to select an address in memory and pins making it possible to read and write the programmable component at the selected address. These different pins have not been shown in FIG. 1 for clarity reasons.

The watchdog circuit 42 includes an input pin WDI1 connected to the output pin WDI0 of the programmable component and an output pin WDO (WatchDog Input) connected, through a diode 43, to the input pin CONFIG of the programmable component. The watchdog circuit 42 can send a reconfiguration signal on its WDO1 output, when no inhibition signal has been applied on its input WDI1 for a predetermined period of time D. The period D can be adjusted by choosing the values of the capacitor 41.

The latch 44 is bistable. It can be set low 0 or set high 1. This state is maintained, even when the system is off.

A status signal of the latch is sent on the output pin Q thereof.

The latch 44 also has an input pin CLK for controlling a change in the state of the latch. This input is connected to the output WDO of the watchdog circuit 42. Thus, upon each reception of a reconfiguration signal coming from the watchdog circuit 42, the latch 44 changes states and goes from the high level 1 to the low level 0 or from the low level 0 to the high level 1.

The output pin Q of the latch 44 and the pin WR of the programmable component 10 are connected as input of the first "OR" logic element 45, the output of which is connected to the node P1.

The input of the logic inverter element 49 is connected to the node P1, while its output is connected to the node P2. Thus, if the signal in P1 is high 1, the signal in P2 will be set low 0 and if the signal in P1 is set low 0, the signal in P2 will be set high 1.

The three pins DATA1, DCLK1 and ASD1 of the first configuration memory 22 are connected to the corresponding pins DATA0, DCLK0, ASD0 of the programmable component 10.

The pin CS1 of the first configuration memory 22 is connected to the output of the second "OR" logic element 46, the inputs of which are respectively connected to the node P1 and the pin CS0 of the programmable component 10.

The three pins DATA2, DCLK2 and ASD2 of the second configuration memory 24 are also connected to the corresponding pins DATA0, DCLK0, ASD0 of the programmable component 10, deriving from the corresponding connections between the first configuration memory 22 and the programmable component 10.

The pin CS2 of the second configuration memory 24 is connected to the output of the third "OR" logic element 48, the inputs of which are respectively connected to the node P2 and the pin CS0 of the programmable component, deriving from the corresponding connection between the first configuration memory 24 and the programmable component 10.

Lastly, the inputs of the fourth "OR" logic element 47 are respectively connected to the output pin ADR0[24] of the programmable component 10 and the node P2, while the output of the fourth "OR" logic element 47 is connected to the pin ADR[24] of the application memory 30.

The logic elements perform an "Exclusive OR" logic operation (corresponding to a "NAND" operation) whose truth table is the following:

| INPUT 1 | INPUT 2 | OUTPUT |
|---------|---------|--------|
| 0 | 0 | 0 |
| 0 | 1 | 1 |
| 1 | 0 | 1 |
| 1 | 1 | 0 |

On this basis, the following truth table indicates the different possible states of the system, indicating the level of the signal on the pins or nodes indicated by their references (the underlined references correspond to decision support variables, while the other references correspond to calculated variables):

| Q | WR | P1 | P2 | CS0 | CS1 | CS2 | ADR0[24] | ADR[24] |
|---|----|----|----|-----|-----|-----|----------|---------|
| 0 | 0 | 0 | 1 | 0 | 0 | 1 | 0 | 1 |
|   |   |   |   | 1 | 1 | 0 | 1 | 0 |
| 0 | 1 | 1 | 0 | 0 | 1 | 0 | 0 | 0 |
|   |   |   |   | 1 | 0 | 1 | 1 | 1 |
| 1 | 0 | 1 | 0 | 0 | 1 | 0 | 0 | 0 |
|   |   |   |   | 1 | 0 | 1 | 1 | 1 |
| 1 | 1 | 0 | 1 | 0 | 0 | 1 | 0 | 1 |
|   |   |   |   | 1 | 1 | 0 | 1 | 0 |

Figure 2:
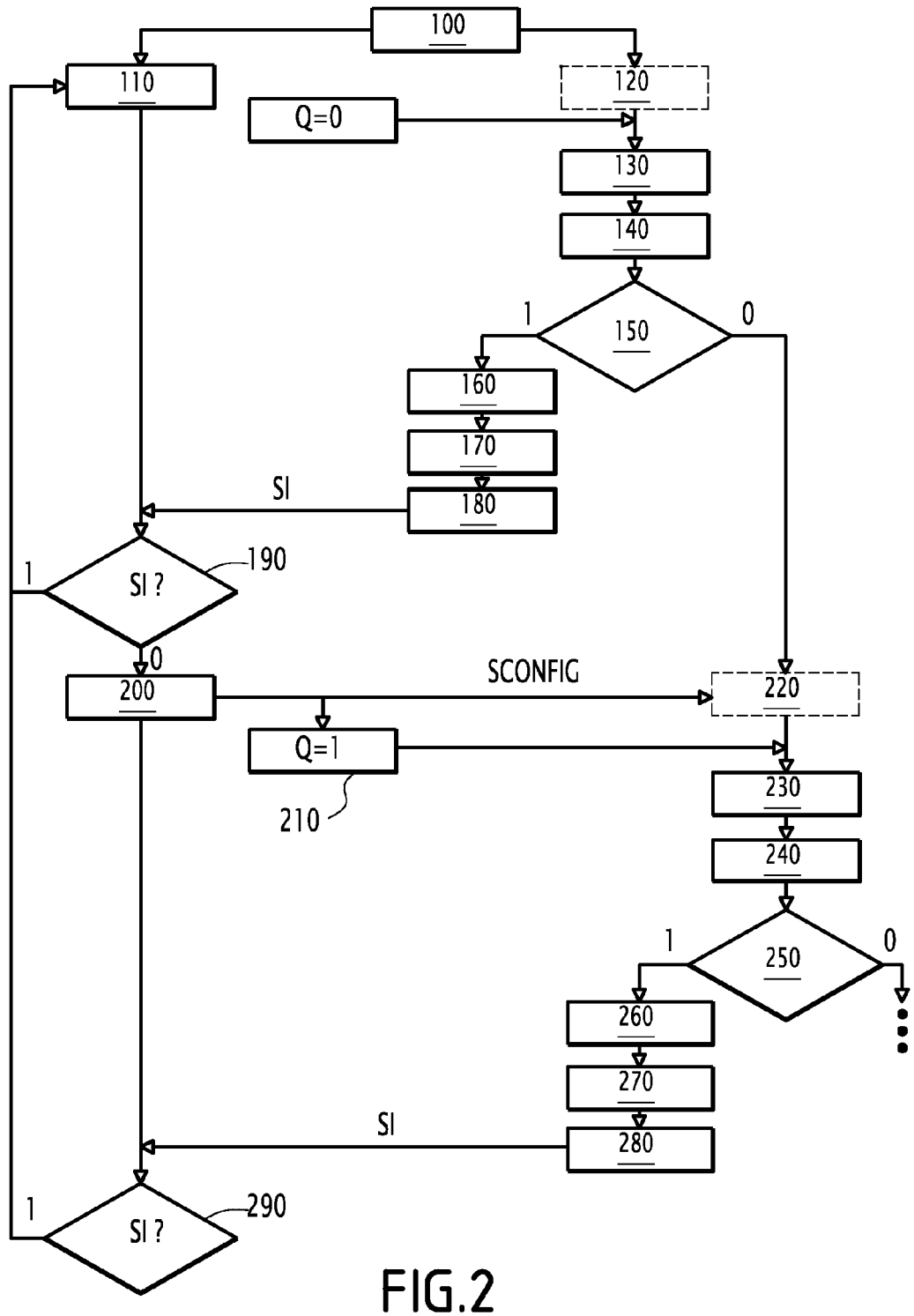
FIG. 2 is a flowchart showing the steps of the configuration of the programmable component of FIG. 1.

The method used by the system previously described will now be presented in reference to FIG. 2.

In step 100, the system is powered on. This results in initializing the clock of the watchdog circuit 42 (step 110). At that moment the latch 44 is, for example, set low 0.

This also results in the logic block 14 of the programmable component 10 initiating a configuration phase 120. This starts with a step during which the programmable component seeks to access a configuration file. The signal CS0 is then high 1.

The latch 44 being set low 0 and the signal WR being, for example, set low 0, the signal at the node P1 is set low 0, while that at the node P2 is set high.

It follows that the output of the logic element 46 is set high 1 and the output of the logic element 48 is set low 0.

As a result, the burn-in circuit of the configuration allows the programmable component 10 to access (step 130) the first configuration memory 22.

The programmable component 10 then reads the first configuration file 23.

Once this reading is complete, the signal CS0 goes back into the low state 0.

In step 140, the logic block 14 configures the core 12 of the programmable component according to the first configuration file.

If the configuration of the programmable component finishes successfully (step 150=1), the programmable component 10 then seeks to access an application code to be executed. To that end, it sends a signal ADR0[24] set high 1.

Given the fact that the other input of the logic element 47 is set high 1, the output of the logic element 47 is set low 0. As a result, the programmable component 10 accesses a zone of the application memory grouping together the addresses whereof the bit with a high weight is equal to 0. Thus, the programmable component accesses the first zone 32 of the application memory. In step 160, the programmable component reads the first application code 33. This in fact involves code that is executable by the first microprocessor resulting from the configuration of the programmable component according to the first file 23.

In step 170, the programmable component executes said first application code, which includes, inter alia, instructions relative to the sending of an inhibition signal of the burn-in circuit 40.

As a result, in step 180, the programmable component 10 sends an inhibition signal SI assuming the high value 1.

The inhibition signal SI being received by the watchdog circuit 42 before the end of the period D (step 190=1), the watchdog circuit 42 reinitializes its clock (return to step 110).

If, however, the configuration phase of the programmable component from the first file is not successful (step 150=0), for example because this first configuration file is corrupted, the watchdog circuit 42 does not receive any inhibition signal SI during the period D (step 190=0).

As a result, in step 200, the watchdog circuit 42 sends a reconfiguration signal SCONFIG.

The reconfiguration signal is applied on the CONFIG input of the programmable component 10 so that the logic block 14 of the programmable component initiates a new configuration phase (step 220).

At the same time, the reconfiguration signal is applied as input of the latch 44 to modify the state thereof. The current state of the latch goes from value 0 to value 1 (step 210).

The signal Q being set high 1 and the signal WR being set low 0, the signal at the node P1 is set high 1, while that at the node P2 is set low 0.

Thus, when the configuration phase leads to the sending on the pin CS0 of an access signal to the configuration memory, the output signal of the logic element 46 is set low 0, while the output signal of the logic element 48 is set high 1. As a result, the programmable component is now connected to the second configuration memory 24 and accesses it (step 230).

The programmable component 10 then reads the second configuration file 25.

Once this reading is finished, the signal CS0 goes back to its low state 0.

In step 240, the logic block 14 configures the core 12 of the programmable component according to this second configuration file in order to configure it as a second microprocessor.

If the configuration of the programmable component is successfully completed (step 250=1), the programmable component 10 seeks to access an application code to execute. To that end, it sends a signal ADR0[24] set high 1.

Since the other input of the element 47 is set low 0, the output of the element 47 is then set high 1. As a result, the programmable component 10 accesses a zone of the application memory 30 characterized by addresses whereof the bit with the high weight is equal to 1. Thus, the programmable component 10 effectively accesses the second zone 34 of the application memory. In step 260, the programmable component reads the second application code 35, which effectively corresponds to the code executable by the second microprocessor resulting from the configuration of the programmable component according to the second file 35.

In step 270, the programmable component executes the second application code.

The latter includes, inter alia, instructions relative to the sending of an inhibition signal SI of the burn-in circuit 42. As a result, in step 280, the programmable component sends, on its pin WDI0, an inhibition signal SI assuming the high value 1.

The inhibition signal SI being received by the watchdog circuit 42 of the burn-in circuit 40 before the end of the period D (step 290=1), the watchdog circuit reinitializes its clock (return to step 110) and does not send a configuration signal.

Figure 3:
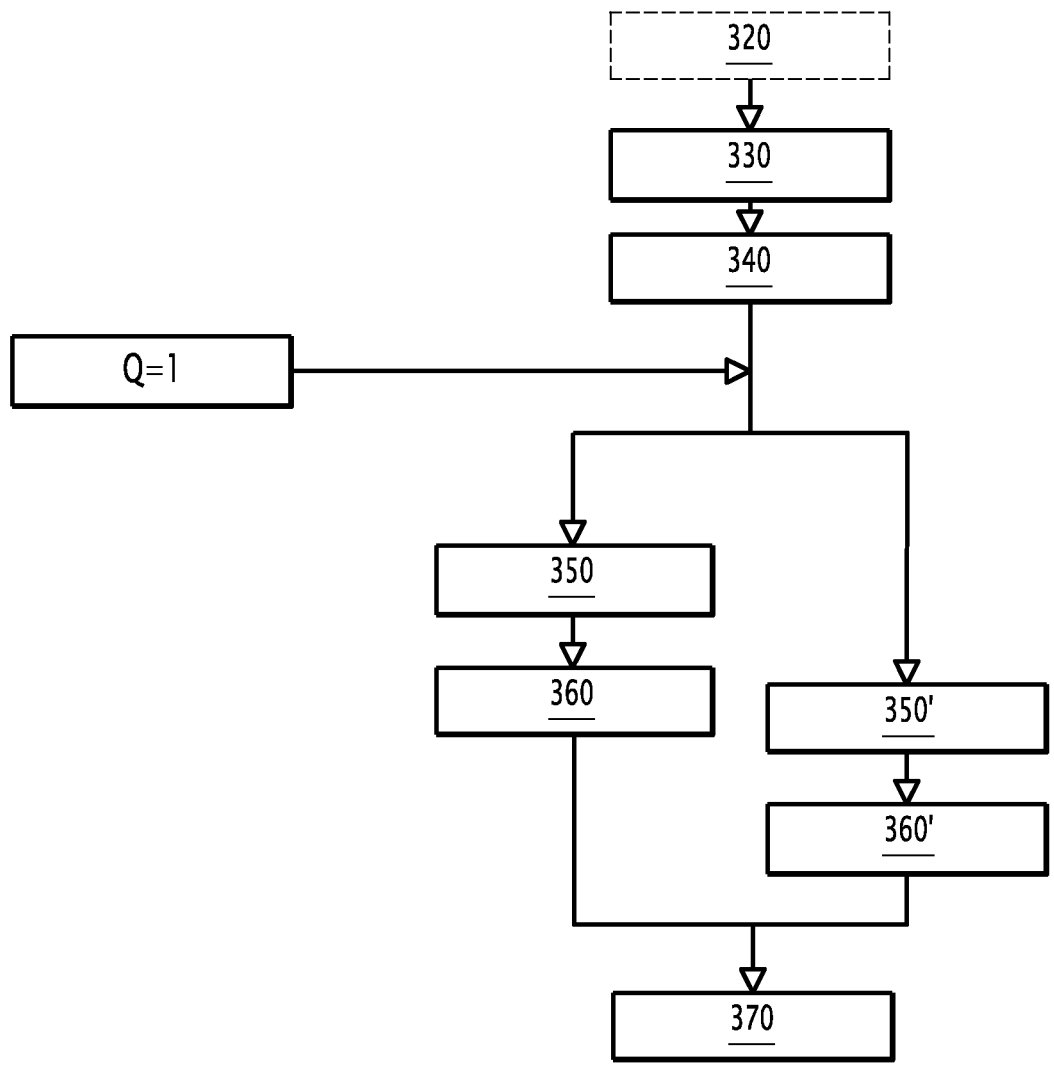
FIG. 3 is a flowchart showing the steps of the writing, by the programmable component of FIG. 1, of a new configuration file in place of a corrupted configuration file.

The method can advantageously continue, during the normal execution of the second application code, by a phase for writing a new configuration file replacing the first configuration file having led to a failure of the configuration phase. This write phase 320 will now be described in reference to FIG. 3.

The programmable component 10 downloads (step 330) a new configuration file and an associated application code from outside the system, through a set of adapted connections.

The programmable component 10 is responsible for writing the new file in the configuration memory and the application code in the application memory.

To write in the first configuration memory, which is the memory that is opposite that containing the current configuration file of the programmable component, in step 340, the programmable component 10 sends a signal on its pin WR assuming the high value 1.

The latch being set high 1, the output of the element 45 at the node P1 is set low 0, while the output of the logic element 49 at the node P2 is set high 1.

As a result, in step 350, when the programmable component seeks to access the configuration memory by emitting a signal CS0 set high 1, the output of the logic element 46 is set high 1, while the output of the logic element 48 is set low 0.

Under these conditions, the input/output pins of the programmable component are effectively connected to the first configuration memory 22.

The programmable component 10 writes (step 360) the new downloaded configuration file, in the first configuration memory replacing the first, corrupted configuration file.

At the end of the writing in the configuration memory, the signal CS0 is set low 0 (step 370).

The programmable component therefore does not alter the second configuration file, which is stored in the second configuration memory 24 and allowed the current configuration of the programmable component.

In step 350', when the programmable component seeks to access the application memory, it sends a signal ADR0[24] set high 1. The output of the logic element 47 is set low 0.

Under these conditions, the input/output pins of the programmable component are effectively connected with the first application memory 32.

The programmable component 10 writes (step 360') the new downloaded application code, in the first application memory by replacing the first application code.

At the end of writing in the application memory, the signal ADR0[24] is set low 0 (step 370).

The programmable component therefore does not modify the second application code stored in the second application memory and that is currently executed by the programmable component.

Figure 4:
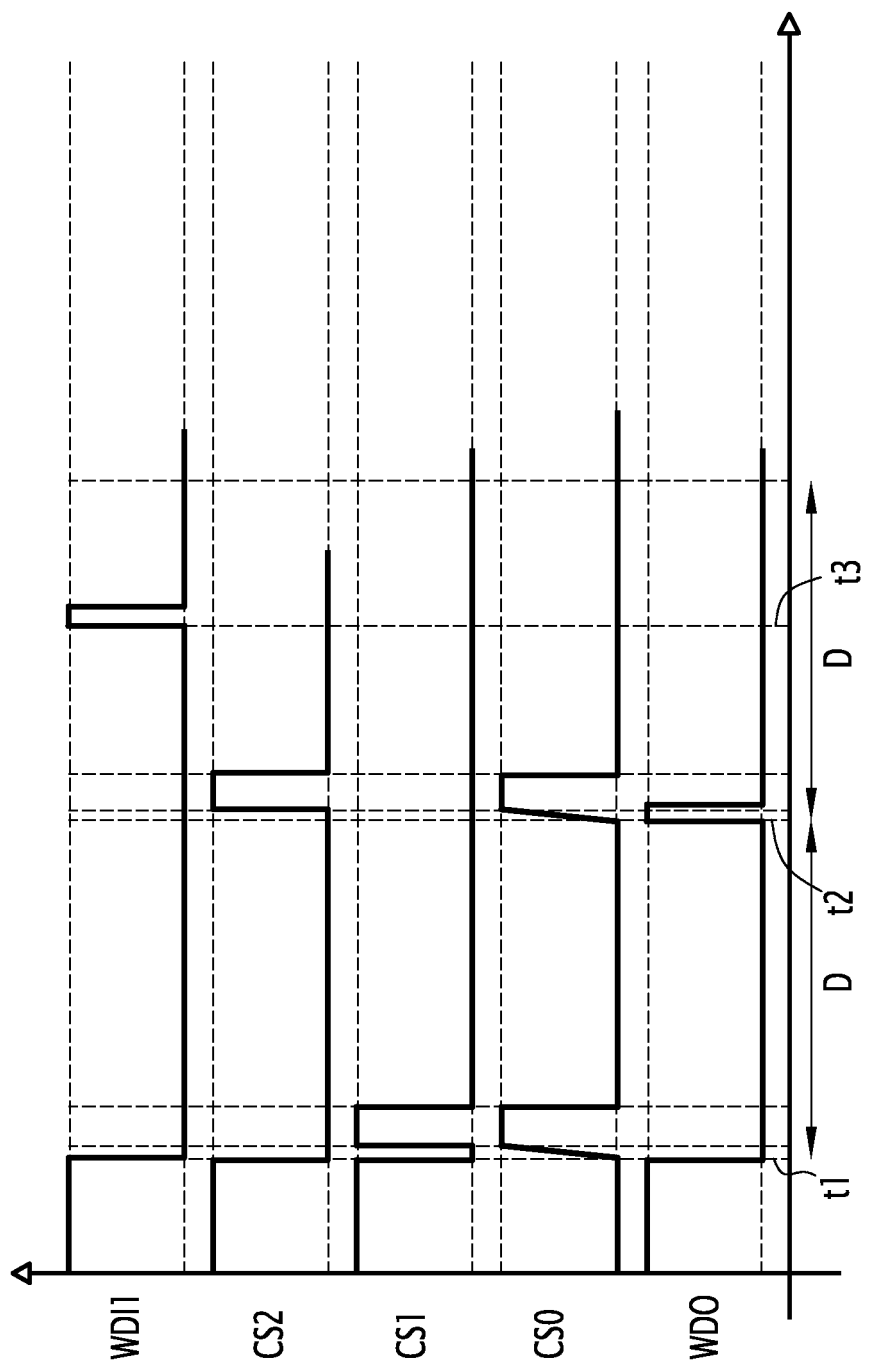
FIG. 4 is a timing chart showing the states of various components of the system of FIG. 1.

FIG. 4 shows, in the form of a timing chart, the signals on the pins WDO of the watchdog circuit, CS0 of the programmable component, CS1 of the first configuration memory 22, CS2 of the second configuration memory 24, and WDI1 of the watchdog circuit (corresponding to the pin WD0 of the programmable component).

At moment t1, the system is powered on.

A first configuration phase of the programmable component 10 then starts.

First, it accesses the configuration memory by modifying the level of the signal CS0. This results in selecting the first configuration memory 22: the signal CS1 goes into the high state 1, while the signal CS2 remains low 0.

Once the first configuration file has been read, the signal CS0 goes back into the low state 0, like the signal CS1.

The programmable component then tries to configure itself according to the first configuration file 23. This first configuration file being corrupted, the configuration phase fails and does not end before the period D.

No inhibition signal being received on the pin WDI1 of the watchdog circuit 42, the latter sends a reconfiguration signal on the input CONFIG of the programmable component, at moment t2. This also results in modifying the state of the latch 44.

The programmable component then initiates a second configuration phase.

The programmable component seeks to access a configuration file. To that end, it modifies the level of the signal CS0, which goes into the high state 1.

But, given the state of the latch 44, this results in selecting the second configuration memory 24: the signal CS2 goes to the high value 1, while the signal CS1 remains at the low level 0.

The programmable component reads the second configuration file 25.

At the end of this access to the configuration memory, the programmable component replaces the signal CS0 set low 0. This is why the signal CS2 also returns to its low level 0 at that time.

The programmable component uses the second file to configure itself. The configuration phase finishes correctly. The programmable component then loads the second application code 35 and executes it. An inhibition signal SI is sent from the programmable component 10 to the watchdog circuit 42, at moment t3. The time interval between the two moments t2 and t3 being shorter than the period D, the clock of the watchdog circuit 42 is reset before a reconfiguration signal is sent by the watchdog circuit on its output WDO.

It will be noted that, in the diagram of FIG. 1, the pin CONFIG of the programmable component and the pin WDO of the watchdog circuit are connected through a diode 43. A reconfiguration signal generated by the watchdog circuit can thus be applied on the pin CONFIG while altering the state of the latch 44, while a reconfiguration signal applied on the pin CONFIG from outside the system, e.g. using a JTAG connection, cannot be applied on the input of the latch. The diode protects the latch and prevents untimely changes in the state of the latch during a configuration controlled from the outside, for example during a test of a configuration file and/or application code.

In the embodiment of FIG. 1, the first and second configuration memory spaces assume the form of two mutually independent memories, while the first and second application memory spaces assume the form of a single unique memory divided into two separately addressable zones. One skilled in the art will understand that, in other embodiments, the first and second configuration memory spaces assume the form of a single memory subdivided into two zones, and/or that the first and second application memory spaces assume the form of two independent memories.

The programmable component must periodically emit an inhibition signal of the watchdog circuit. This is a traditional function for the usual, "non-reconfigurable" microprocessors. In fact, such a microprocessor is usually associated with a watchdog circuit that, if it does not receive inhibition signals from the microprocessor (for example blocked in the execution of an endless loop of instructions), sends a reset signal for the microprocessor.

In another alternative, independent from the preceding ones, the system has N configuration files, stored in N configuration memory spaces, and N application codes, stored in N application memory spaces. Each code is associated with a single configuration file. The burn-in circuit therefore has N levels.

Alternatively, the programmable component incorporates all or part of the burn-in circuit for its configuration. Such an advanced programmable component advantageously corresponds to the meeting within a same device of elements 10, 42, 43, 44, 45, 46, 47, 48, 49 of FIG. 1. One skilled in the art will note that the previously mentioned elements are of the same type as the component elements of the programmable components: watchdog circuits, latches and logic elements, etc. It is easy to provide for them and incorporate them during the manufacture of the improved programmable component. Furthermore, these elements are simple and reliable.

In still another alternative, with the aim of increasing the safety of the system's operation, the first configuration memory space is a non-reconfigurable memory having a factory configuration file and in which it is impossible to write again; while the second configuration memory space is a reconfigurable memory having a configuration file for updating the configuration and in which it is possible to write a new configuration file by overwriting the previous one. The use of the programmable component is then kept in check in that it is then only possible to modify, during use of the programmable component, the second configuration file corresponding to an update of the configuration. One is thus sure that in the event this second configuration were to be corrupted, the programmable component could be configured from the factory configuration file. The burn-in circuit previously described in detail must be adapted not to propose write access to the first configuration memory space. What has been indicated for the configuration memory spaces is also applicable to the application memory spaces.

The invention claimed is:

1. A programmable device, comprising:
    a programmable component capable of managing its own configuration, from a configuration file, having an output able to send an inhibiting signal upon successful configuration of the programmable component and an input able to receive a reconfiguration signal;
    a circuit for the automatic burn-in of the configuration of the programmable component, having:
        selection device having at least two states in a first state, the selection device connects the programmable component to a first configuration memory space having a first configuration file, at least when the programmable component seeks to access a configuration file in read mode and, in a second state, the selection device connects the programmable component to a second configuration memory space having a second configuration file, at least when the programmable component seeks to access a configuration file in read mode; and
        a watchdog device having an input able to receive the inhibition signal sent by the programmable component and an output able to send, when no inhibition signal has been received for a predetermined period of time, a configuration signal intended for the programmable component to command the reconfiguration thereof and for the selection-device to modify the state thereof.

2. The device according to claim 1, wherein said programmable component, once configured as a microprocessor, can execute an application code associated with the configuration file used, and in that the selection device:
    in said first state, connect the programmable component to a first application memory space having a first application code, at least when the programmable component seeks to access an application in ready-only mode; and
    in said second state, connect the programmable component to a second application memory space having a second application code, at least when the programmable component seeks to access an application in read-only mode.

3. The device according to claim 1, wherein the selection device comprises:
    a latch with at least two states including an input for controlling a change in the state of the latch and an output indicating the current state of the latch, said input being connected to said output of the watchdog device able to send a reconfiguration signal; and
    a plurality of logic components that connect the programmable component to the first configuration memory space or to the second configuration memory space, depending on the current state of the latch.

4. The device according to claim 2, wherein the plurality of logic components connect the programmable component to the first application memory space or the second application memory space, depending on the current state of the latch.

5. The device according to claim 3, wherein the programmable component has an output pin to send an access signal indicating that it is trying to access a configuration file, and the plurality of logic components can connect the programmable component to the first configuration memory space or the second configuration memory space, depending on the current state of said access signal.

6. The device according to claim 4, wherein the programmable component has an output pin to send an access signal indicating that it is seeking to access an application code, and in that the plurality of logic components can connect the programmable component to the first application memory space or the second application memory space, depending on the current state of said access signal.

7. The device according to claim 1, wherein said first configuration memory space is a non-reconfigurable memory and has a factory configuration file, in that said second configuration memory space is a reconfigurable memory and has an update configuration file, and in that, the programmable component being configured from the factory configuration file or the update configuration file, said selection device can connect the programmable component to the second configuration memory space, at least when the programmable component seeks to access a configuration memory in write mode to write a new update configuration file there.

8. The device according to claim 3, wherein the programmable component has an output to send a write-mode selection signal for a configuration memory space in which to write a new configuration file, and in that the plurality of logic components connect the programmable component to the first configuration memory space or the second configuration memory space, depending on the write-mode selection signal.

9. The device according to claim 1 wherein said programmable component includes the burn-in circuit for the configuration.

10. The device according to claim 1, wherein the programmable component is of the FPGA type.

11. A programmable system comprising a device according to claim 1 and
    first and second configuration memory spaces respectively including first and second configuration files, and
    first and second application memory spaces respectively including first and second application codes, the first code being executable by the programmable component of said device configured from said first configuration file and the second code being executable by the programmable component of said device configured from said second configuration file, the burn-in circuit of the configuration of the programmable component serving as a connection interface between the programmable component and said memory spaces.

12. The system according to claim 11, wherein the system is closed.

13. A configuration method for a programmable component capable of managing its own configuration, from a configuration file, including the following steps:
- connecting the programmable component to a first configuration memory space including a first configuration file, at least when the programmable component seeks to access a configuration file in read mode; by placing a selection device of the programmable component into a first state; and, in the event the configuration of the programmable component fails, from the first configuration file; and
- commanding a reconfiguration of the programmable component and connecting the programmable component to a second configuration memory space having a second configuration file at least when the programmable component seeks to access a configuration file in read mode, by placing the selection device of the programmable component into a second state;
- receiving an inhibition signal sent by the programmable component via an input in a watchdog device, and
- sending a configuration signal to the programmable component via an output in the watchdog device, to command the reconfiguration thereof and modify the state of the selection device, when no inhibition signal has been received for a predetermined period of time.

14. The method according to claim 13, wherein said programmable component, once configured as a microprocessor, being able to execute an application code associated with the configuration file used, the method includes the following steps:
- connecting the programmable component to a first application memory space including a first application code, at least when the programmable component is seeking to access an application code in read mode; and, in the event the configuration of the programmable component from the first configuration file fails,
- connecting the programmable component to a second application memory space having a second application code, at least when the programmable component is seeking to access an application code in read mode.

15. The method according to claim 13, wherein once the programmable component is configured using the configuration file contained in one of the first and second configuration memory spaces and executing the associated application code, the method includes the following steps:
- downloading by the programmable component of a new configuration file;
- connecting the programmable component to the other configuration memory space when the programmable component is seeking to access the configuration memory space in write mode.

* * * * *